US006630735B1

United States Patent
Carlson et al.

(10) Patent No.: US 6,630,735 B1
(45) Date of Patent: Oct. 7, 2003

(54) INSULATOR/METAL BONDING ISLAND FOR ACTIVE-AREA SILVER EPOXY BONDING

(75) Inventors: Lars S. Carlson, Del Mar, CA (US); Shulai Zhao, Encinitas, CA (US)

(73) Assignee: Digirad Corporation, San Diego, CA (US)

( * ) Notice: Subject to any disclaimer, the term of this patent is extended or adjusted under 35 U.S.C. 154(b) by 0 days.

(21) Appl. No.: 09/547,061

(22) Filed: Apr. 7, 2000

Related U.S. Application Data

(60) Provisional application No. 60/128,626, filed on Apr. 9, 1999.

(51) Int. Cl.[7] .............................................. H01L 23/48

(52) U.S. Cl. ....................... 257/734; 257/738; 257/778; 257/709

(58) Field of Search ................................ 257/723, 725, 257/737, 740, 738, 777, 778, 780, 734, 709

(56) References Cited

U.S. PATENT DOCUMENTS 5,793,117 A * 8/1998 Shimada et al. ............ 257/780
5,796,591 A * 8/1998 Dala et al. .................. 361/779
5,866,949 A * 2/1999 Schueller .................... 257/778
6,040,630 A * 3/2000 Panchou et al. ............ 257/783
6,078,100 A * 6/2000 Duesman et al. ........... 257/690

OTHER PUBLICATIONS

"Degradation Effects at Aluminum–Silicon Schottky Diodes", A. Castaldini, et al., The Electrochemical Society, Inc., *Electrochemical and Solid–State Letters*, 1(2) 83–85 (1998).

* cited by examiner

*Primary Examiner*—Kamand Cuneo
*Assistant Examiner*—Lourdes Cruz
(74) *Attorney, Agent, or Firm*—Fish & Richardson P.C.

(57) ABSTRACT

A semiconductor interconnection device having a semiconductor die, a plurality of epoxy bonds, and an array of insulating islands is disclosed. The semiconductor die has a plurality of conductive contacts. The plurality of epoxy bonds has a metallic substance such as silver. The epoxy bonds are configured to provide interconnection between the semiconductor die and an external structure. The plurality of epoxy bonds is selectively applied to the plurality of conductive contacts on the semiconductor die and corresponding conductive contacts on the external structure. The array of insulating islands is coupled to the plurality of conductive contacts. The islands are configured to prevent migration of the metallic substance from the plurality of epoxy bonds to the semiconductor die through the plurality of conductive contacts.

14 Claims, 3 Drawing Sheets

INSULATOR/METAL BONDING ISLAND FOR ACTIVE-AREA SILVER EPOXY BONDING

CROSS-REFERENCE TO RELATED APPLICATION

This application claims benefit of the priority of U.S. Provisional Application Ser. No. 60/128,626, filed Apr. 9, 1999 and entitled "An Oxide/Metal Bonding Island for Active Area Silver Conductive Epoxy Bonding."

BACKGROUND

This invention relates to semiconductor detectors, and more particularly to the improvement of the electrical and mechanical integrity of such detectors connected to external structures or electronics.

In a conventional flip-chip 100 shown in FIG. 1, a semiconductor chip or die can have bumped terminations spaced around an active area of the die. The terminations are intended for face-to-face attachment of the semiconductor die to a substrate 102 or another semiconductor die. The bumped terminations of the flip-chip 100 often include an array of minute solder balls or epoxy bonds 104 disposed on a front attachment surface of a semiconductor die. The attachment of a flip-chip 100 to a substrate 102 or another semiconductor involves aligning the epoxy bonds 104 on the flip-chip 100 with a plurality of contact points 106 on a facing surface 108 of the substrate 102. The contact points 106 are configured to be a mirror image of the epoxy bond arrangement 104 on the flip-chip 100. A plurality of epoxy bonds 104 may also be formed on the facing surface of the substrate 102 at the contact points 106. In some applications, semiconductor illumination detector chips are attached to structures such as printed circuit boards (PCBs) or signal processing electronics in a flip-chip interconnection.

Several techniques exist for forming flip-chip interconnections between semiconductor photodetectors and external structures. These include solder bump interconnection, silver epoxy bonding, and indium bump bonding. The silver epoxy bonding is a relatively simple technique that has been widely used for flip-chip bonding of semiconductor photodetectors to external structures. The silver epoxy is silver-filled epoxy having a suspension of silver particles in an epoxy paste. The paste, mixed with a compatible hardening agent, is applied in liquid form to the contacts on the photodetector and/or the external structures. The front surfaces of the chip and external structure are aligned mechanically. The surfaces are then brought into sufficiently close proximity so that the silver epoxy forms a bridge between the mating contacts on the two components. However, the liquid nature of the epoxy itself imposes limits on the minimum spacing between adjacent contacts that can be bonded. An appropriate curing cycle causes the silver epoxy to cure into conductive, rigid or semi-rigid, interconnections between the two components.

Since the metal electrical contacts on a photodetector often resides directly on the surface of the semiconductor material itself, any migration of the components of the silver epoxy through the metal contact can cause degradation of the electrical properties of photodetector structures. Further, an exposure of the flip-chip photodetector to repeated cycles between low and high temperatures may cause failure of the electrical and mechanical connection. Such failures are often caused by mechanical stresses to the assembly resulting from the difference between the coefficients of thermal expansion (CTE) of the semiconductor material and the external structure. Forces applied to the assembly by other means may also cause failure of the interconnection. In some cases, the stresses on the metal-to-semiconductor interface are sufficient to pull a portion of the semiconductor material away from the surface of the chip.

SUMMARY

The present disclosure includes a semiconductor interconnection device having a semiconductor die, a plurality of epoxy bonds, and an array of insulating islands. The semiconductor die has a plurality of conductive contacts. The plurality of epoxy bonds contains a metallic component such as silver. The epoxy bonds are configured to provide interconnection between the semiconductor die and an external structure. The plurality of epoxy bonds is selectively applied to the plurality of conductive contacts on the semiconductor die and corresponding conductive contacts on the external structure. The array of insulating islands is coupled to the plurality of conductive contacts. The islands are configured to prevent migration of the metallic substance from the plurality of epoxy bonds to the semiconductor die through the plurality of conductive contacts.

The present disclosure also includes a method of manufacturing a flip-chip interconnection device. The method includes providing an array of insulating islands on a semiconductor die, applying a plurality of metal contacts over the array of insulating islands, and selectively depositing an array of epoxy bonds on the plurality of metal contacts. The array of insulating islands prevents migration of metallic component in the array of epoxy bonds into the semiconductor die.

The details of one or more embodiments of the invention are set forth in the accompanying drawings and the description below. Other features, objects, and advantages of the invention will be apparent from the description and drawings, and from the claims.

DETAILED DESCRIPTION

In recognition of the above, a new system has been developed to provide flip-chip connection with reduced degradation of the electrical and mechanical properties. The inventors recognized that in forming a flip-chip interconnection using silver epoxy bonding, the degradation of the electrical properties of metal-semiconductor structures was caused by silver migration into the active area. This recognition is supported by A. Castaldini, Degradation Effects at Aluminum-Silicon Schottky Diodes, Electrochemical and Solid-State Letters, Vol. 1, No. 2, pp. 83–85 (1998).

Figure 1:
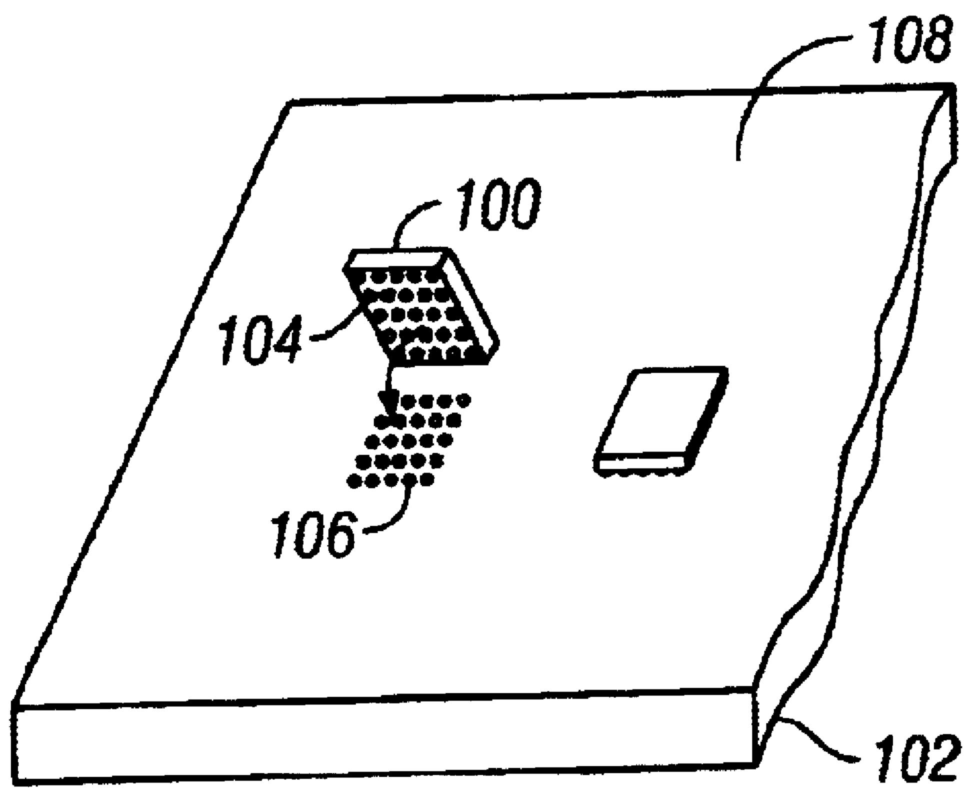
FIG. 1 is a top perspective view showing a flip-chip interconnection with an external structure substrate.
Figure 2:
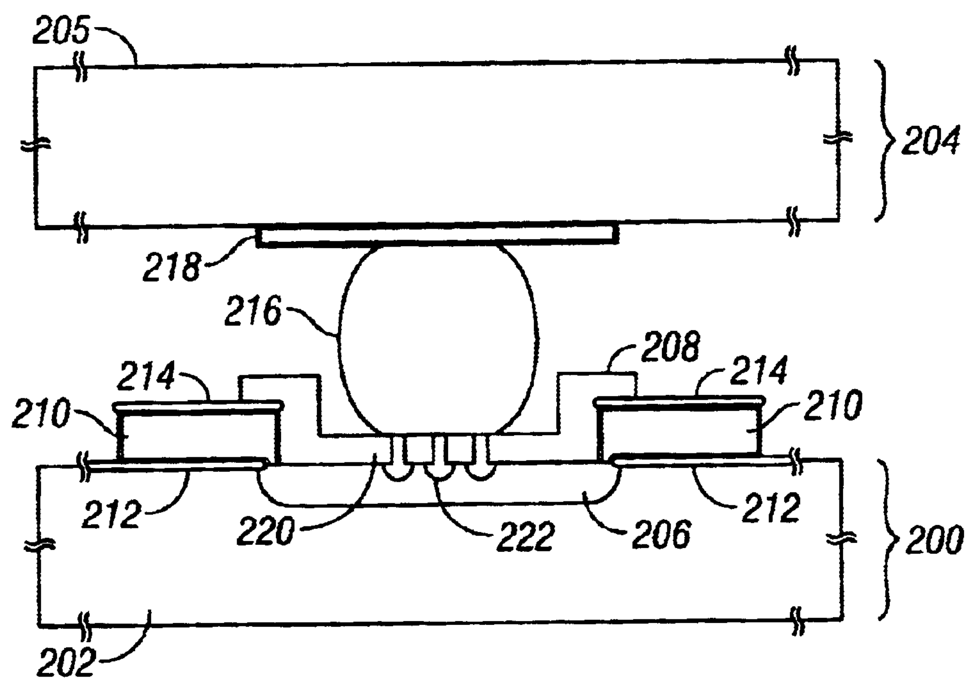
FIG. 2 is a cross-section of a conventional p-i-n photodiode connected to an external structure by means of a silver epoxy bond.

A simplified cross-section of a conventional semiconductor detector, such as a photovoltaic detector or a photoconductive detector, is shown in FIG. 2. The photovoltaic detector can include a p-n junction photosensor, a p-i-n diode photodetector, or a metal-semiconductor (Schottky) photosensor. As an example, FIG. 2 is described in terms of a p-i-n diode photodetector or a p-i-n photodiode 200. The p-i-n photodiode 200 is formed on a semiconductor substrate 202, and is connected to a mating contact 218 on a substrate 205 of an external structure 204. Near the top surface of the lightly doped n-type semiconductor substrate 202, a heavily doped p-type region 206 has been fabricated. The lightly doped n-type semiconductor is often denoted as intrinsic or i-type. A heavily doped n-type layer and an appropriate contact (not shown) complete the p-i-n structure.

In conventional silicon (Si) technology, a thermally-grown silicon dioxide field oxide 210 is formed over a face surface 212 of a semiconductor wafer 202 to passivate the Si surface. The oxide thus acts as a passivation film 210. The passivation film 210 is selectively etched to expose the conductive electrode 206 formed with the heavily doped-p-type region. A metal contact 208 is then applied over the face surface 214 of the passivation film 210. The conductive electrode 206 formed with the heavily doped p-type region facilitates formation of an ohmic connection to the metal contact 208. For photodiodes fabricated in other materials, suitable insulators may be grown or deposited for passivation.

A silver epoxy bond 216 connects the metal contact 208 to the mating contact 218 on the substrate 205 of the external structure 204. Silver migration through the metal contact 208 at several locations 220 is shown. The silver migration at these locations 220 leads to the formation of silver-contaminated regions 222 at and/or below the semiconductor surface. These regions 222 degrade the electrical properties of the semiconductor device such as a photodetector.

Figure 3:
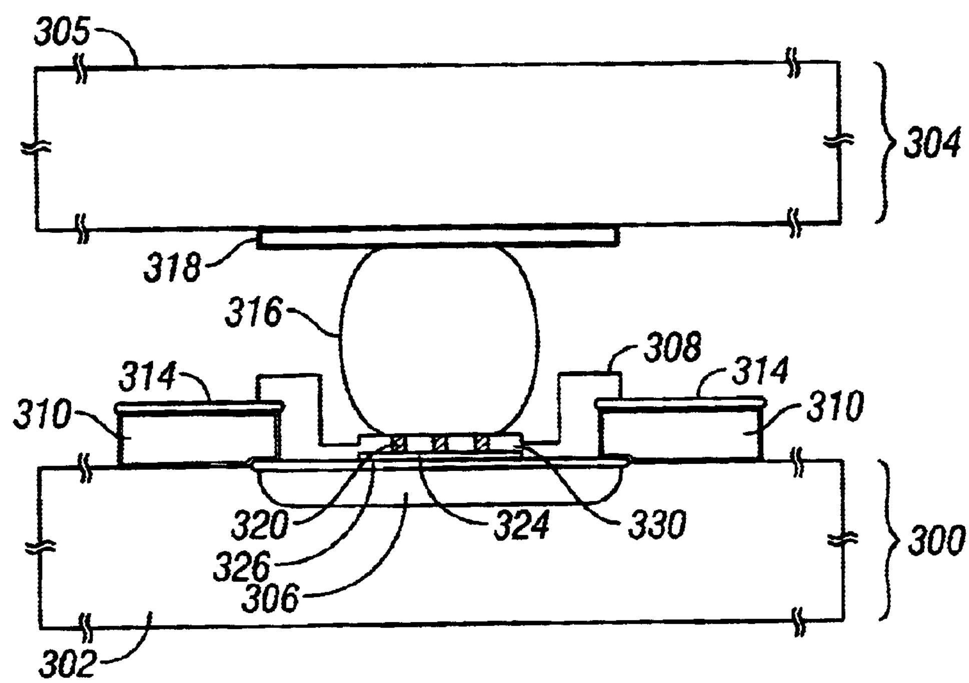
FIG. 3 is a cross-section of a p-i-n photodiode in accordance with one embodiment of the present invention.

FIG. 3 shows a new semiconductor illumination detector, such as a p-i-n photodiode 300, in accordance with one embodiment of the present system. The present p-i-n photodiode 300 promotes prevention of degradation by silver migration.

In the photodiode structure 300 of FIG. 3, an insulating island 324 is formed on the surface 326 of the heavily doped p-type conductive electrode 306 prior to deposition of the metal contact 308. Once the metal contact 308 is applied over the face surface 314 of the passivation film 310, the silver epoxy bond 316 connects the metal contact 308 to the mating contact 318 on the substrate 305 of the external structure 304. Again, the silver migration through the metal contact 308 occurs at several points 320. However, in contrast to the situation depicted in FIG. 2, the insulating island 324 acts as a barrier to silver migration. The insulating island 324 prevents the formation of contaminated regions such as those represented by 222 in FIG. 2. Therefore, degradation of the photodiode 300 by silver contamination is substantially reduced.

In one embodiment, the insulating island 324 comprises a layer of insulating material. In another embodiment, the insulating island 324 is thermally grown silicon dioxide.

The portion of the metal contact 308 directly over the insulating island 324 is referred to as an insulator/metal bonding structure 330. This insulator/metal bonding structure 330 provides a direct contact between the silver epoxy bond 314 and the semiconductor material 306, thereby providing the required electrical connection between the photodiode 300 and the external structure 320.

The insulating island 324 also provides a mechanical buffer region to mitigate the transmission of stress from the silver epoxy bond into the semiconductor. The most common stress is due to the inherently large coefficient of thermal expansion (CTE) mismatch between the semiconductor substrate and the substrate of the external structure. The electronic packages are subject to two types of heat exposures: process cycles, which are often high in temperature but few in number; and operation cycles, which are numerous but less extreme. If either the flip chips or substrates are unable to repeatedly bear their share of the system thermal mismatch, on or more elements of the electronic package will fracture, which destroys the functionality of the electronic package.

As an electronic package dissipates heat to its surroundings during operation, or as the ambient system temperature changes, differential thermal expansions cause stresses to be generated in the interconnection structures between the semiconductor die and the substrate. These stresses produce instantaneous elastic and, most often, plastic strain, as well as time-dependent strains in the joint, especially within its weakest segment. Thus, the CTE mismatch between chip and substrate will cause a shear displacement to be applied on each terminal which can fracture the connection.

Figure 4:
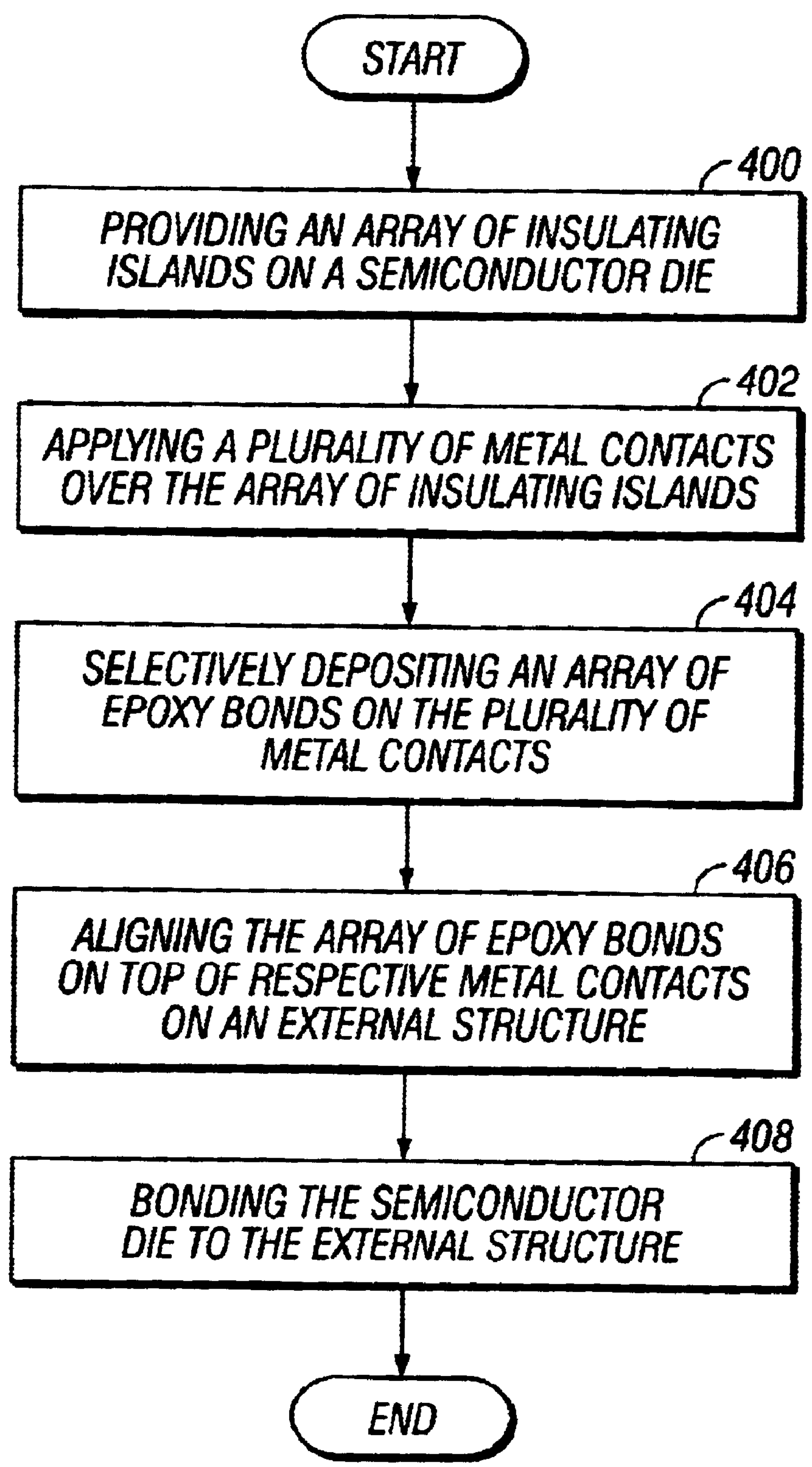
FIG. 4 is a flowchart of a flip-chip interconnection device manufacturing process in accordance with an embodiment of the present invention Like reference symbols in the various drawings indicate like elements.

FIG. 4 is a flowchart of a flip-chip interconnection device manufacturing process in accordance with an embodiment of the present invention. At step 400, an array of insulating islands is provided on a semiconductor die. A plurality of metal contacts is applied over the array of insulating islands at step 402. An array of epoxy bonds is selectively deposited on the plurality of metal contacts at step 404. At step 406, the array of epoxy bonds is aligned on top of respective metal contacts on an external structure. Finally, the semiconductor die is bonded to the external structure at step 408.

Insulator/metal bonding islands 324, 330, as described in connection with FIG. 3, have been embodied in silicon p-i-n photodiode arrays with sixteen individual photodiode pixels in a 4×4 array. These arrays were fabricated in high resistivity (>1000 ohm-cm) silicon substrates using conventional silicon process technology. Active p-type contacts to these devices were approximately 2.9×2.9 $mm^2$. Circular, thermally grown silicon dioxide bonding islands approximately 630 micrometers in diameter and nominally 0.25 micrometers thick were fabricated at one or more locations over each active p-type contact. A thermally-grown silicon dioxide field oxide, nominally 1 micrometer thick, passivated the gaps between the pixels and over other regions of the chips. Metal contacts were formed by sputter deposition of approximately 1 micrometer of aluminum containing nominally 1% of dissolved silicon (Al:1%Si) over nearly the entire active p-type region and overlapping the edges of the field oxide. In some embodiments, a double-layer metal system, having Al:1%Cu over Al:1%Si, with each layer nominally 1 micrometer thick was used. The second metal layer was connected to the first layer through holes etched in a second-level passivation insulator and deposited over the field oxide. Both silicon dioxide and silicon nitride have been used for this second-level passivation. The single and double-layer metal systems have been used in conjunction with an under bump metallization (UBM) system. The UBM is used to facilitate fabrication of solder balls on the chips. The UBM used in the embodiment is fabricated on top of the metal contacts by addition of 5 to 7 micrometers of nickel deposited by electroless plating, followed by approximately 0.2 micrometers of electroless gold.

All of the metal systems were subject to silver migration. Both of the layers in this type of UBM were porous, and fabrication of these layers frequently left gaps between the UBM and the walls of the second layer glass through which silver could migrate.

Several versions of the photodiode arrays have been produced with each chip requiring 18 to 20 silver-epoxy bonds to printed circuit boards (PCBs). The PCBs carried external signal processing electronics. Silver epoxy has been used for direct chip-to-PCB bonds and also in hybrid silver epoxy/solder bump bonds. Thousands of chips have been bonded to PCBs by one or both of these methods, and chip/PCB assemblies fabricated by these methods have been embodied into prototype and production versions of the DIGIRAD 2020tc™, a commercial solid-state gamma-ray imager.

Even under accelerated life tests, almost no performance degradation attributable to silver migration was observed. Although any contamination of the semiconductor material by silver migration would degrade the leakage currents of these devices, the test results showed that the photodiode arrays have extremely low reverse-bias leakage currents less than 1 $nA/cm^2$. It is important to note that these devices are uniquely sensitive to contamination because they have such low leakage currents.

A number of embodiments of the invention have been described above for illustrative purposes. Nevertheless, it will be understood that various modifications may be made without departing from the spirit and scope of the invention. For example, the term p-i-n is used in the above description to represent collectively p-i-n and p-n structures and their complementary n-p and n-i-p devices. All statements and claims with respect to specific semiconductor structures are for illustrative purposes only. They apply qualitatively to the complementary structure in which all of the following can be simultaneously replaced with their (polarity-reversed) complement: conductivity types, charge carriers, electrical potentials and electric fields. Accordingly, other embodiments are within the scope of the following claims.

What is claimed is:

1. A semiconductor interconnection system, comprising:

a semiconductor die;

first and second conductive contacts, said first conductive contact coupled to a surface of said semiconductor die, and said second conductive contact coupled to an external structure;

a silver epoxy bond interposed between said first and second conductive contacts, said epoxy bond providing electrical and mechanical interconnection between said semiconductor die and said external structure;

a plurality of silver migration regions in the first conductive contact extending from the silver epoxy bond toward the surface of said semiconductor die; and an insulating island interposed between said silver migration regions and the surface of said semiconductor die, wherein the first conductive contact is in contact with the surface of said semiconductor die in a region adjacent the insulating island.

2. The system of claim 1, wherein said semiconductor die is a photodetector.

3. The system of claim 2, wherein said photodetector is a p-i-n photodiode.

4. The system of claim 1, wherein said insulating island comprises a layer of oxide.

5. The system of claim 1, wherein the first conductive contact is in contact with the surface of said semiconductor die in a region surrounding the insulating island.

6. A semiconductor interconnection system, comprising:

a semiconductor die;

first and second conductive contacts, said first conductive contact coupled to a surface of said semiconductor die, and said second conductive contact coupled to an external structure;

a silver epoxy bond interposed between said first and second conductive contacts, said epoxy bond providing electrical and mechanical interconnection between said semiconductor die and said external structure; and an insulating island configured to prevent migration of silver from said silver epoxy bond to said semiconductor die through said first conductive contact; and a conductive electrode heavily doped with p-type material at the surface of said semiconductor die to provide electrical connection between said semiconductor die and said external structure.

7. The system of claim 6, further comprising an insulator/metal bonding structure disposed above said insulating island, said insulator/metal bonding island providing direct contact between the silver epoxy bond and the conductive electrode, thereby providing required electrical connection between said semiconductor die and said external structure.

8. The system of claim 1, wherein said semiconductor die is silicon and the insulating island is thermally grown silicon dioxide.

9. The system of claim 1, wherein said insulating island provides reduction in transmission of mechanical stress from said silver epoxy bond into the semiconductor die.

10. A semiconductor flip-chip, comprising:

a semiconductor die having a plurality of conductive contacts;

a plurality of epoxy bonds having a metallic component, said epoxy bonds configured to provide interconnection between said semiconductor die and an external structure, said plurality of epoxy bonds selectively applied to said plurality of conductive contacts on said semiconductor die and corresponding conductive contacts on the external structure;

a plurality of metallic component migration regions in each of said plurality of conductive contacts; and an insulating island corresponding to each of the plurality of epoxy bonds, each insulating island interposed between one of said plurality of conductive contacts and a surface of the semiconductor die, wherein each of said plurality of conductive contacts is in contact with the surface of the semiconductor die in a region adjacent the corresponding insulating island.

11. The flip-chip of claim 10, wherein said metallic substance is silver.

12. The flip-chip of claim 10, wherein said semiconductor die is a semiconductor illumination detector chip.

13. The flip-chip of claim 10, wherein said plurality of conductive contacts on said semiconductor die forms connections to an array of photodiode pixels.

14. The flip-chip of claim 13, wherein said array of insulating islands prevents degradation of low reverse-bias leakage currents in said array of photodiode pixels.

* * * * *